(12) United States Patent
Chiang et al.

(10) Patent No.: US 11,114,939 B2
(45) Date of Patent: Sep. 7, 2021

(54) POWER SUPPLY SYSTEM WITH CURRENT COMPENSATION

(71) Applicant: MACROBLOCK, INC., Hsinchu (TW)

(72) Inventors: Ting-Ta Chiang, Hsinchu (TW); Kuan-Yu Chen, Hsinchu (TW)

(73) Assignee: MACROBLOCK, INC., Hsinchu (TW)

( * ) Notice: Subject to any disclaimer, the term of this patent is extended or adjusted under 35 U.S.C. 154(b) by 0 days.

(21) Appl. No.: 16/905,725

(22) Filed: Jun. 18, 2020

(65) Prior Publication Data
US 2020/0412242 A1    Dec. 31, 2020

(30) Foreign Application Priority Data
Jun. 28, 2019   (TW) .................................. 108122920

(51) Int. Cl.
| | |
|---|---|
| *H02M 3/155* | (2006.01) |
| *H05B 45/48* | (2020.01) |
| *H02M 1/08* | (2006.01) |
| *H03K 3/037* | (2006.01) |
| *H03K 19/0175* | (2006.01) |
| *H02M 1/00* | (2006.01) |

(52) U.S. Cl.
CPC ............ *H02M 3/155* (2013.01); *H02M 1/08* (2013.01); *H03K 3/037* (2013.01); *H03K 19/017509* (2013.01); *H05B 45/48* (2020.01); *H02M 1/0009* (2021.05)

(58) Field of Classification Search
CPC ........ H02J 1/00; H02J 1/14; H02J 3/00; H02J 3/14; H02M 1/00; H02M 1/08; H02M 2001/00; H02M 2001/0009; H02M 2001/009; H02M 3/00; H02M 3/155; H02M 3/33561; H03K 19/00; H03K 19/017509; H03K 3/00; H03K 3/037; H05B 45/00; H05B 45/48; Y02B 70/00; Y02B 70/3225
USPC .......................................................... 307/31
See application file for complete search history.

(56) References Cited

U.S. PATENT DOCUMENTS

| | | | |
|---|---|---|---|
| 2008/0031025 A1* | 2/2008 | Wang ..................... | H02M 3/156 363/78 |
| 2017/0302193 A1* | 10/2017 | Zhang .................... | H02M 1/08 |
| 2018/0287507 A1* | 10/2018 | Yamada ................. | H02M 1/08 |
| 2019/0068098 A1* | 2/2019 | Iijima .................... | H02P 27/08 |
| 2020/0220377 A1* | 7/2020 | Chen ................... | G08B 13/1895 |

\* cited by examiner

*Primary Examiner* — Lincoln D Donovan
*Assistant Examiner* — Dave Mattison
(74) *Attorney, Agent, or Firm* — Akerman LLP; Peter A. Chiabotti (57) ABSTRACT

A power supply system includes a current driver circuit, a sensor circuit, a control circuit, a voltage generator circuit and a signal generator circuit. The current driver circuit generates, based on a pulse signal, an output current for driving a load unit that includes series connected loads. The sensor circuit senses the output current to generate a sensed voltage. For each load, the control circuit is operable, based on a control input, to allow or not to allow the output current to flow through the load. The voltage generator circuit generates a reference voltage based on the control input. The signal generator circuit generates the pulse signal based on the reference voltage and the sensed voltage.

8 Claims, 6 Drawing Sheets

POWER SUPPLY SYSTEM WITH CURRENT COMPENSATION

CROSS-REFERENCE TO RELATED APPLICATION

This application claims priority of Taiwanese Patent Application No. 108122920, filed on Jun. 28, 2019.

FIELD

The disclosure relates to a power supply system, and more particularly to a power supply system with current compensation.

BACKGROUND

Figure 1:
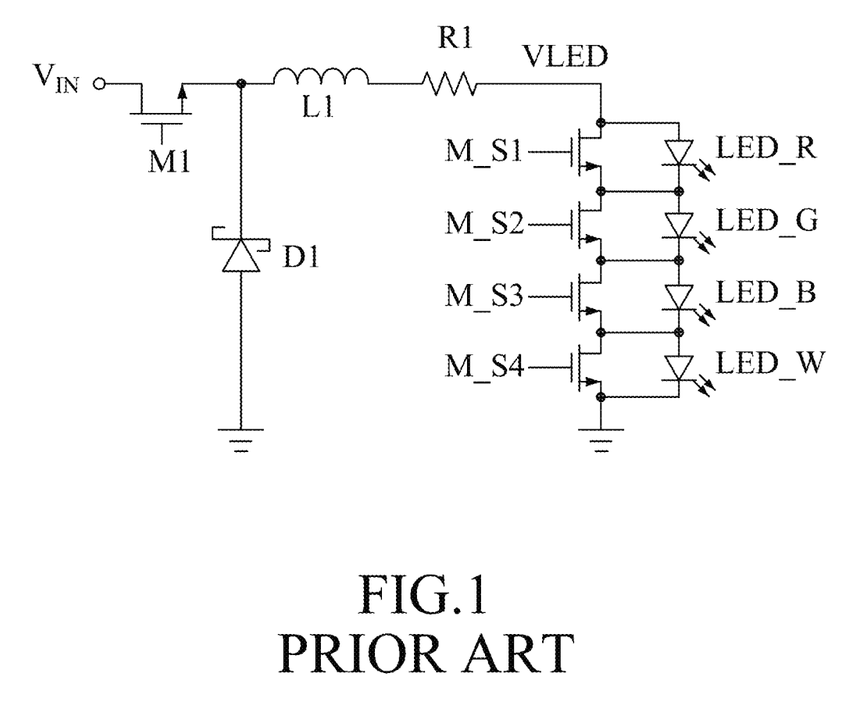
FIG. 1 is a circuit diagram illustrating a conventional hysteretic power supply system in use with multiple light emitting diodes (LEDs)
Figure 2:
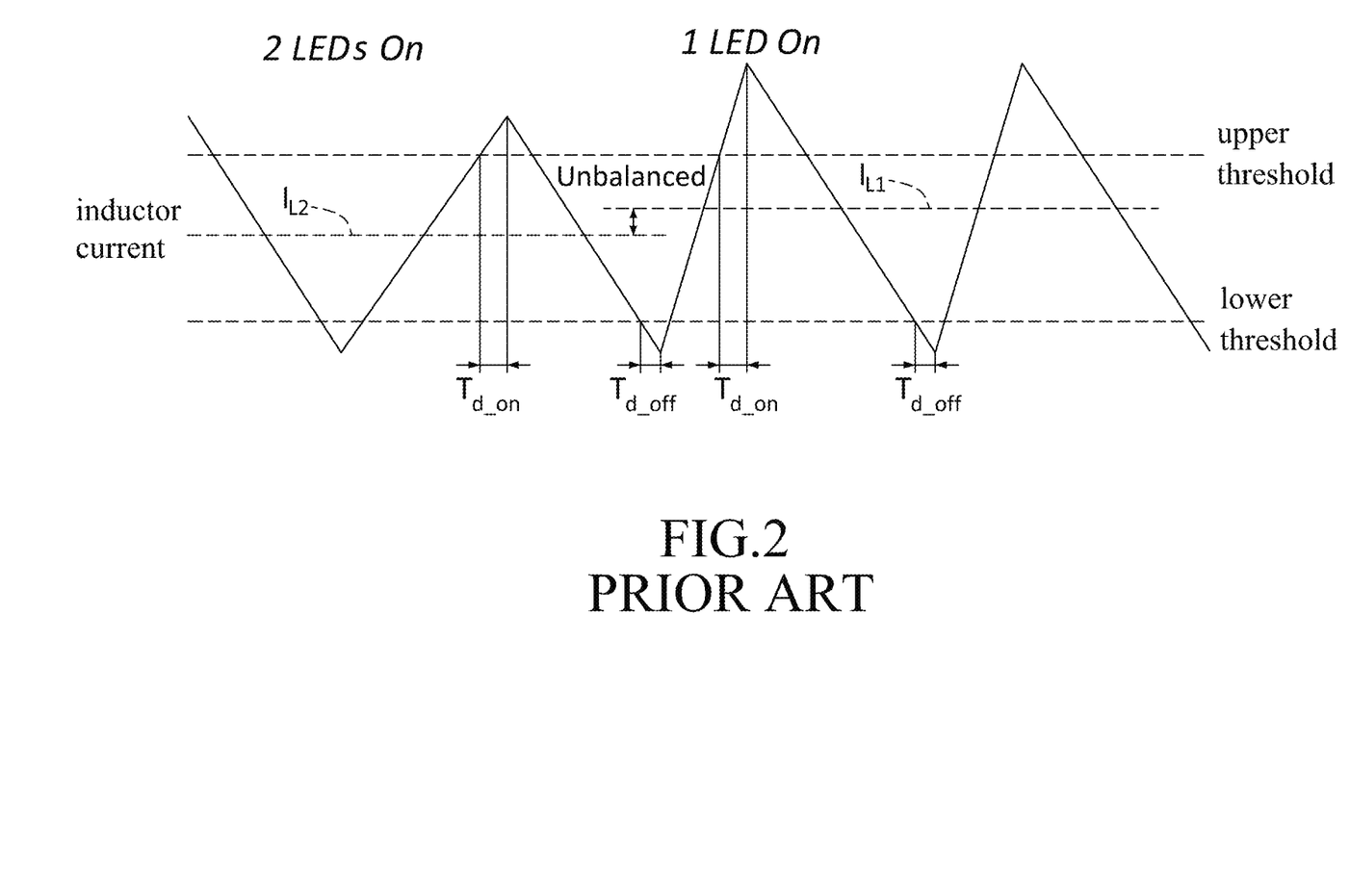
FIG. 2 is a timing diagram schematically illustrating an inductor current of the conventional hysteretic power supply system in various scenarios, in which a number of one(s) of the LEDs that emit(s) light is different.

FIG. 1 illustrates a conventional hysteretic power supply system for dimming control of multiple light emitting diodes (LEDs) (LED_R, LED_G, LED_B, LED_W). Referring to FIGS. 1 and 2, a switch (M1) is switched to an OFF state when an inductor current (i.e., a current flowing through an inductor (L1)) increases to become greater than an upper threshold, and is switched to an ON state when the inductor current decreases to become smaller than a lower threshold. An average of the inductor current is expected to be constantly equal to an average of the upper and lower thresholds.

In addition, dimming of the LEDs (LED_R, LED_G, LED_B, LED_W) can be adjusted by changing operating states of switches (M_S1-M_S4).

Figure 3:
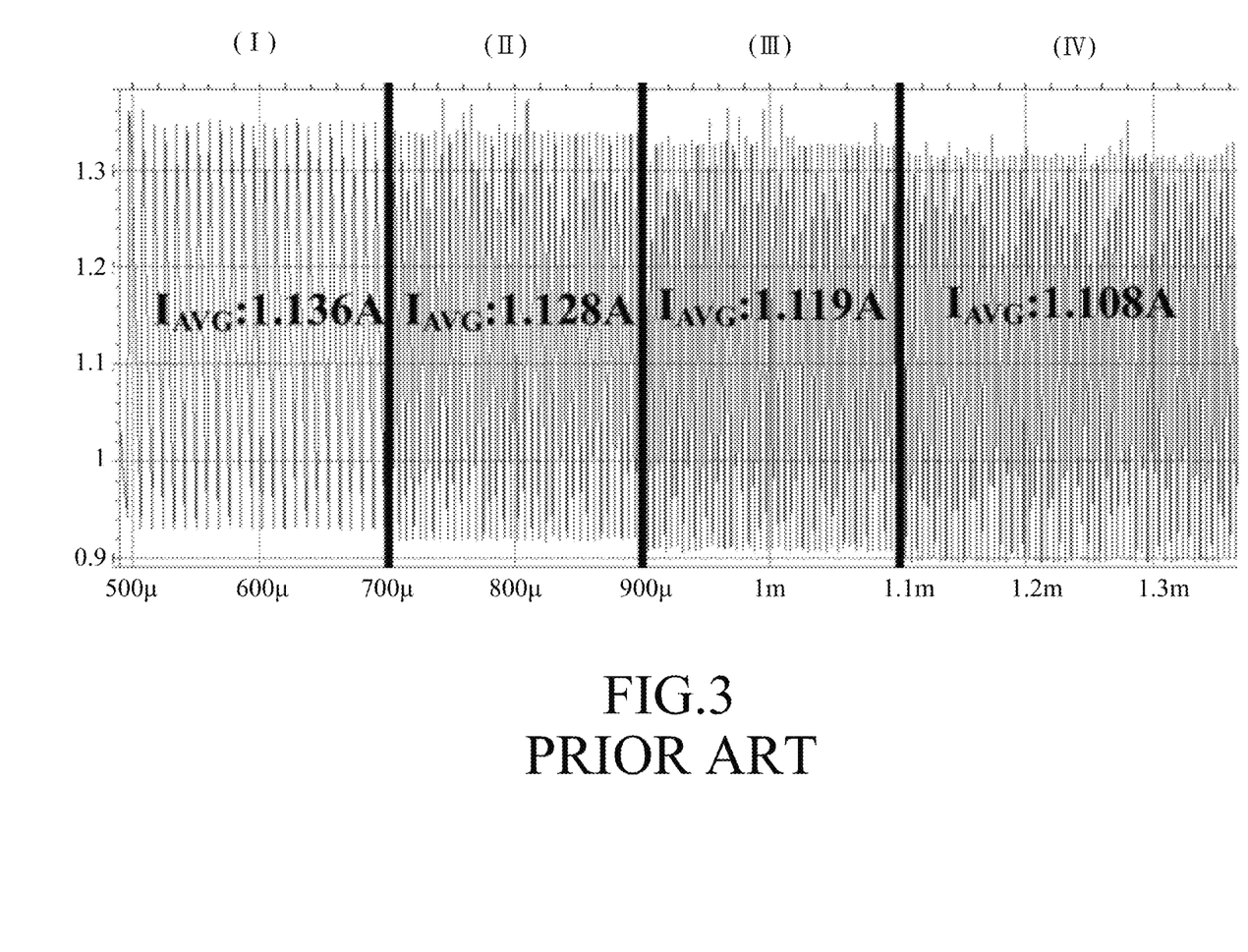
FIG. 3 is a timing diagram illustrating measurement result of the inductor current of the conventional hysteretic power supply system in various scenarios, in which the number of the one (s) of the LEDs that emit (s) light is different.

However, because of signal propagation delay in the conventional hysteretic power supply system, there presents a time lag by a delay time ($T_{d\_on}$) between an OFF-state time point, at which the switch (M1) enters the OFF state, and an upper-threshold time point, at which the inductor current increases above the upper threshold, and there presents a time lag by a delay time ($T_{d\_off}$) between an ON-state time point, at which the switch (M1) enters the ON state, and a lower-threshold time point, at which the inductor current decreases below the lower threshold. A voltage across the LEDs (LED_R, LED_G, LED_B, LED_W) changes with a number (K), which is a number of one(s) of the LEDs (LED_R, LED_G, LED_B, LED_W) that emit(s) light. Accordingly, an increase slope, a decrease slope, a crest, a trough, the average of the inductor current, and brightness of each of the one(s) of the LEDs (LED_R, LED_G, LED_B, LED_W) that emit(s) light also change with the number (K). As shown in FIG. 2, the average of the inductor current is equal to $I_{L1}$ when K=1, and is equal to $I_{L2}$ when K=2, where $I_{L1} > I_{L2}$. As shown in FIG. 3, K=1 during a time period (I), K=2 during a time period (II), K=3 during a time period (III), K=4 during a time period (IV), and the average of the inductor current ($I_{AVG}$) decreases with increasing K.

SUMMARY

Therefore, an object of the disclosure is to provide a power supply system with current compensation. The power supply system can alleviate the drawback of the prior art.

According to the disclosure, the power supply system is operatively associated with a load unit. The load unit includes a first terminal, a second terminal, and a plurality of loads that are coupled in series between the first and second terminals thereof. The power supply system includes a current driver circuit, a sensor circuit, a control circuit, a voltage generator circuit and a signal generator circuit. The current driver circuit is to receive a pulse signal, and generates an output current based on the pulse signal. The output current increases within each pulse of the pulse signal, and decreases outside each pulse of the pulse signal. The sensor circuit is coupled to the current driver circuit, and is adapted to be further coupled to the first terminal of the load unit. The sensor circuit allows the output current to flow therethrough from the current driver circuit to the first terminal of the load unit, and senses the output current to generate a sensed voltage. The control circuit is adapted to be coupled to the loads, and is to receive a control input. For each of the loads, the control circuit is operable, based on the control input, to allow or not to allow the output current to flow through the load. The voltage generator circuit is to receive the control input, and generates a reference voltage based on the control input. The reference voltage is correlated to a number of one (s) of the loads through which the output current flows. The signal generator circuit is coupled to the sensor circuit, the voltage generator circuit and the current driver circuit, and is to receive the sensed voltage and the reference voltage respectively from the sensor circuit and the voltage generator circuit. The signal generator circuit generates a first threshold voltage and a second threshold voltage based on the reference voltage, and compares the sensed voltage with the first and second threshold voltages to generate the pulse signal for receipt by the current driver circuit.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Before the disclosure is described in greater detail, it should be noted that throughout the disclosure, when two elements are described as being "coupled in series," "connected in series" or the like, it is merely intended to portray a serial connection between the two elements without necessarily implying that the currents flowing through the two elements are identical to each other and without limiting whether or not an additional element is coupled to a common node between the two elements. Essentially, "a series connection of elements," "a series coupling of elements" or the like as used throughout the disclosure should be interpreted as being such when looking at those elements alone.

Figure 4:
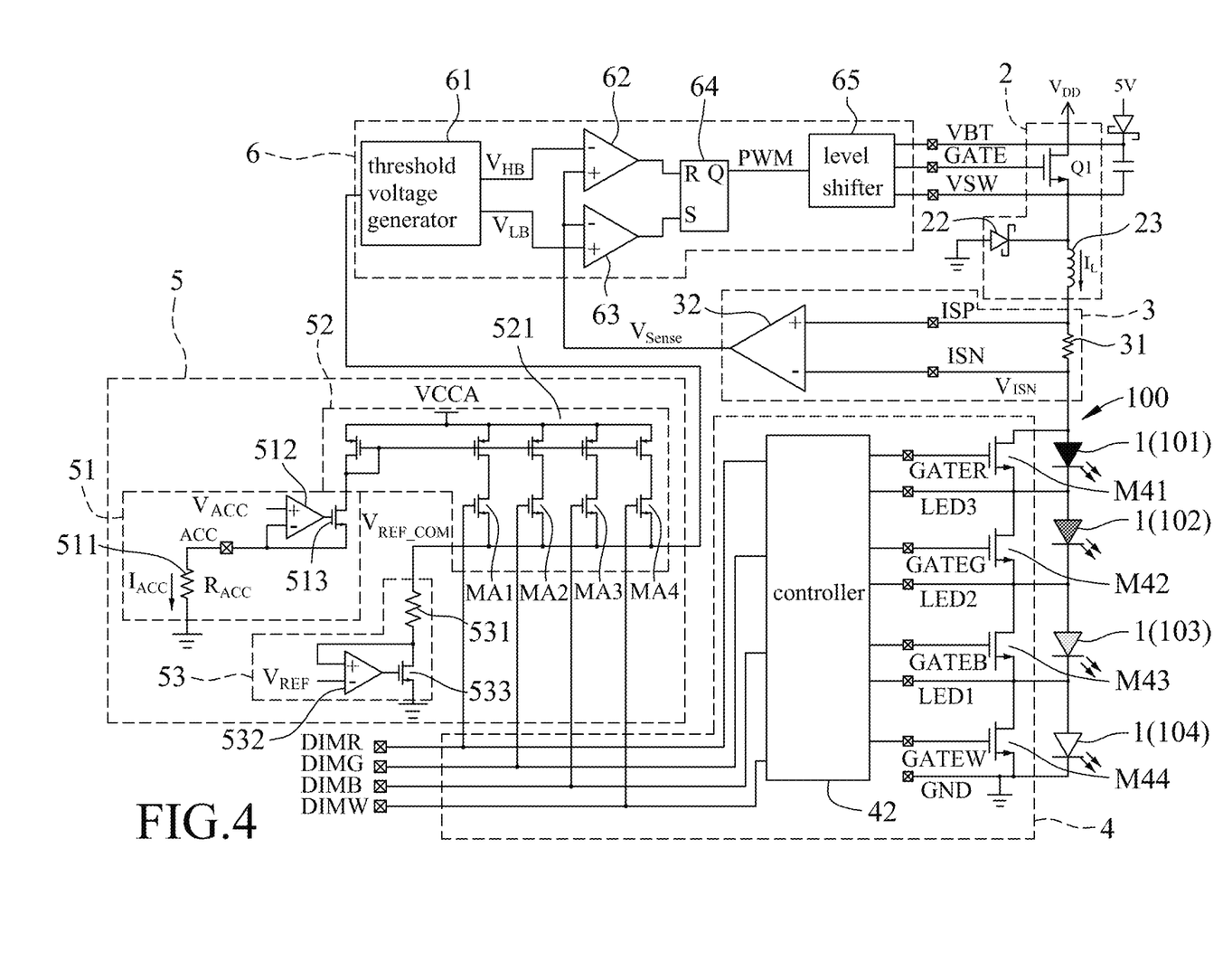
FIG. 4 is a circuit block diagram illustrating an embodiment of a power supply system according to the disclosure in use with a load unit that includes a plurality of loads.

Referring to FIG. 4, an embodiment of a power supply system according to the disclosure is operatively associated with a load unit 100. The load unit 100 includes a first terminal, a second terminal that is coupled to ground, and a number (N) of loads 1 that are coupled in series between the first and second terminals thereof, where N is an integer greater than one. For illustration purposes, N=4 and the loads 1 are respectively light emitting diodes (LEDs) 101-104 of different colors in this embodiment. The power supply system of this embodiment includes a current driver circuit 2, a sensor circuit 3, a control circuit 4, a voltage generator circuit 5 and a signal generator circuit 6.

The current driver circuit 2 is to receive a pulse signal (GATE), and generates an output current ($I_L$) based on the pulse signal (GATE). The output current ($I_L$) increases within each pulse of the pulse signal (GATE), and decreases outside each pulse of the pulse signal (GATE).

In this embodiment, the current driver circuit 2 includes a switch (Q1), a diode 22 and an inductor 23. The switch (Q1) (e.g., an N-type metal oxide semiconductor field effect transistor (nMOSFET)) has a first terminal (e.g., a drain terminal) that is to receive a supply voltage ($V_{DD}$), a second terminal (e.g., a source terminal), and a control terminal (e.g., a gate terminal) that is to receive the pulse signal (GATE). The pulse signal (GATE) transitions between an active state (e.g., a logic "1" state) and an inactive state (e.g., a logic "0" state). The switch (Q) is in the ON state when the pulse signal (GATE) is in the active state (i.e., within each pulse of the pulse signal (GATE)), and is in the OFF state when the pulse signal (GATE) is in the inactive state (i.e., outside each pulse of the pulse signal (GATE)). The diode 22 (e.g., a Schottky diode) has a cathode that is coupled to the second terminal of the switch (Q1), and an anode that is adapted to be coupled to the second terminal of the load unit 100. The inductor 23 has a first terminal that is coupled to the second terminal of the switch (Q1), and a second terminal that provides the output current ($I_L$).

The sensor circuit 3 is coupled to the current driver circuit 2, and is adapted to be further coupled to the first terminal of the load unit 100. The sensor circuit 3 allows the output current ($I_L$) to flow therethrough from the current driver circuit 2 to the first terminal of the load unit 100, and senses the output current ($I_L$) to generate a sensed voltage ($V_{Sense}$).

In this embodiment, the sensor circuit 3 includes a resistor 31 and an amplifier 32. The resistor 31 has a first terminal that is coupled to the second terminal of the inductor 23 to receive the output current ($I_L$) therefrom, and a second terminal that is adapted to be coupled to the first terminal of the load unit 100 to provide the output current ($I_L$) thereto. The amplifier 32 has a non-inverting input terminal that is coupled to the first terminal of the resistor 31, an inverting input terminal that is coupled to the second terminal of the resistor 31, and an output terminal that provides the sensed voltage ($V_{Sense}$).

The control circuit 4 is adapted to be coupled to the LEDs 101-104, and is to receive a control input. For each of the LEDs 101-104, the control circuit 4 is operable, based on the control input, to allow or not to allow the output current ($I_L$) to flow through the LED. Each of the LEDs 101-104 emits light when the output current ($I_L$) flows therethrough.

In this embodiment, the control input includes a number (N) (i.e., four) of control signals (DIMR, DIMG, DIMB, DIMW). Each of the control signals (DIMR, DIMG, DIMB, DIMW) transitions between an active state (e.g., a logic "1" state) and an inactive state (e.g., a logic "0" state). The control circuit 4 includes a number (N) (i.e., four) of switches (M41-M44) and a controller 42. Each of the switches (M41-M44) (e.g., an nMOSFET) is adapted to be coupled to a respective one of the LEDs 101-104 in parallel. The controller 42 is coupled to the switches (M41-M44), is to receive the control signals (DIMR, DIMG, DIMB, DIMW), and controls operation of each of the switches (M41-M44) between an ON state and an OFF state based on a respective one of the control signals (DIMR, DIMG, DIMB, DIMW). To be specific, the controller 42 performs bootstrapping and inverting to generate a number (N) (i.e., four) of signals (GATER, GATEG, GATEB, GATEW), which are respectively complementary to the control signals (DIMR, DIMG, DIMB, DIMW), to respectively control the operations of the switches (M41-M44). Each of the switches (M41-M44) is in the OFF state and the output current ($I_L$) flows through the respective one of the LEDs 101-104 when the respective one of the control signals (DIMR, DIMG, DIMB, DIMW) is in the active state. Each of the switches (M41-M44) is in the ON state and the output current ($I_L$) flows therethrough when the respective one of the control signals (DIMR, DIMG, DIMB, DIMW) is in the inactive state.

The voltage generator circuit 5 is to receive the control input, and generates a reference voltage ($V_{REF\_com}$) based on the control input. The reference voltage ($V_{REF\_com}$) is correlated to a number (K), which is a number of one(s) of the LEDs 101-104 through which the output current ($I_L$) flows (i.e., a number of one(s) of the LEDs 101-104 that emit(s) light).

In this embodiment, the voltage generator circuit includes a first current generator 51, a second current generator 52 and a reference voltage generator 53. The first current generator 51 generates a compensation current ($I_{ACC}$). The second current generator 52 is coupled to the first current generator 51 to receive the compensation current ($I_{ACC}$) therefrom, to receive the control input, and generates a reference current based on the compensation current ($I_{ACC}$) and the control input. The reference current is equal to a product of the compensation current ($I_{ACC}$) and the number (K) (i.e., K×$I_{ACC}$). The reference voltage generator 53 is coupled to the second current generator 52, is to receive the reference current from the second current generator 52, and generates the reference voltage ($V_{REF\_COM}$) based on the reference current.

To be specific, the first current generator 51 includes a resistor 511, an amplifier 512 and a transistor 513. The resistor 511 has a first terminal, a second terminal that is coupled to ground, and a resistance of $R_{ACC}$. The amplifier 512 has a non-inverting input terminal that is to receive a compensation voltage ($V_{ACC}$) (e.g., 1.2V), an inverting input terminal that is coupled to the first terminal of the resistor 511, and an output terminal. The transistor 513 (e.g., an nMOSFET) has a first terminal (e.g., a drain terminal), a second terminal (e.g., a source terminal) that is coupled to the first terminal of the resistor 511, and a control terminal (e.g., the gate terminal) that is coupled to the output terminal of the amplifier 512. The compensation current ($I_{ACC}$) is provided at the first terminal of the transistor 513, and is equal to $V_{ACC}/R_{ACC}$.

To be specific, the second current generator 52 includes a current mirror 521 and a number (N) (i.e., four) of switches (MA1-MA4). The current mirror 521 is coupled to the first terminal of the transistor 513 to receive the compensation current ($I_{ACC}$) therefrom, and generates a number (N) (i.e., four) of mirrored currents based on the compensation current ($I_{ACC}$). Each of the mirrored currents is equal to the compensation current ($I_{ACC}$). Each of the switches (MA1-MA4) (e.g., an nMOSFET) has a first terminal (e.g., a drain terminal), a second terminal (e.g., a source terminal) and a control terminal (e.g., a gate terminal). The first terminals of the switches (MA1-MA4) are coupled to the current mirror 521 to respectively receive the mirrored currents therefrom. The second terminals of the switches (MA1-MA4) are coupled to each other. The control terminals of the switches (MA1-MA4) are to respectively receive the control signals (DIMR, DIMG, DIMB, DIMW). The reference current is provided at a common node of the switches (MA1-MA4). Each of the switches (MA1-MA4) is in an ON state when a respective one of the control signals (DIMR, DIMG, DIMB, DIMW) is in the active state, and is in an OFF state when the respective one of the control signals (DIMR, DIMG, DIMB, DIMW) is in the inactive state.

To be specific, the reference voltage generator 53 includes a resistor 531, an amplifier 532 and a transistor 533. The resistor 531 has a first terminal that is coupled to the common node of the switches (MA1-MA4) to receive the reference current therefrom, a second terminal, and a resistance of $R_{ref}$ (e.g., 1 KΩ)). The amplifier 532 has a non-inverting input terminal that is coupled to the second terminal of the resistor 531, an inverting input terminal that is to receive a base voltage ($V_{REF}$) (e.g., 1V), and an output terminal. The transistor 533 (e.g., an nMOSFET) has a first terminal (e.g., a drain terminal) that is coupled to the second terminal of the resistor 531, a second terminal (e.g., a source terminal) that is coupled to ground, and a control terminal (e.g., a gate terminal) that is coupled to the output terminal of the amplifier 532. The reference voltage ($V_{REF\_com}$) is provided at the first terminal of the resistor 531, and is equal to $V_{REF}+K \times \Delta V$, where $\Delta V = I_{ACC} \times R_{ref} = (V_{ACC}/R_{ACC}) \times R_{ref}$.

The signal generator circuit 6 is coupled to the sensor circuit 3, the voltage generator circuit 5 and the current driver circuit 2, and is to receive the sensed voltage ($V_{Sense}$) and the reference voltage ($V_{REF\_COM}$) respectively from the sensor circuit 3 and the voltage generator circuit 5. The signal generator circuit 6 generates a first threshold voltage ($V_{HB}$) and a second threshold voltage ($V_{LB}$) based on the reference voltage ($V_{REF\_com}$), and compares the sensed voltage ($V_{Sense}$) with the first and second threshold voltages ($V_{HB}$, $V_{LB}$) to generate the pulse signal (GATE) for receipt by the current driver circuit (2).

In this embodiment, the signal generator circuit 6 includes a threshold voltage generator 61, a first comparator 62, a second comparator 63, an RS flip-flop and a level shifter 65. The threshold voltage generator 61 is coupled to the first terminal of the resistor 531 to receive the reference voltage ($V_{REF\_com}$) therefrom, and generates the first and second threshold voltages ($V_{HB}$, $V_{LB}$) based on the reference voltage ($V_{REF\_com}$). The second threshold voltage ($V_{LB}$) is lower than the first threshold voltage ($V_{HB}$), and an average of the first and second threshold voltages ($V_{HB}$, $V_{LB}$) is equal to the reference voltage ($V_{REF\_com}$). The first comparator 62 has an inverting input terminal that is coupled to the threshold voltage generator 61 to receive the first threshold voltage ($V_{HB}$) therefrom, a non-inverting input terminal that is coupled to the output terminal of the amplifier 32 to receive the sensed voltage ($V_{Sense}$) therefrom, and an output terminal. The second comparator 63 has an inverting input terminal that is coupled to the output terminal of the amplifier 32 to receive the sensed voltage ($V_{Sense}$) therefrom, a non-inverting input terminal that is coupled to the threshold voltage generator 61 to receive the second threshold voltage ($V_{LB}$) therefrom, and an output terminal. The RS flip-flop 64 has a reset terminal that is coupled to the output terminal of the first comparator 62, a set terminal that is coupled to the output terminal of the second comparator 63, and an output terminal that provides an intermediate signal (PWM). The level shifter 65 is coupled to the output terminal of the RS flip-flop 64 to receive the intermediate signal (PWM) therefrom, is further coupled to the control terminal of the switch (Q1), and performs bootstrapping to translate the intermediate signal (PWM) from a voltage domain to another voltage domain to generate the pulse signal (GATE) for receipt by the control terminal of the switch (Q1). In operation, the pulse signal (GATE) is set to the logic "1" state when the second comparator 63 determines that the sensed voltage ($V_{Sense}$) is lower than the second threshold voltage ($V_{LB}$), and is reset to the logic "0" state when the first comparator 62 determines that the sensed voltage ($V_{Sense}$) is higher than the first threshold voltage ($V_{HB}$).

Figure 5:
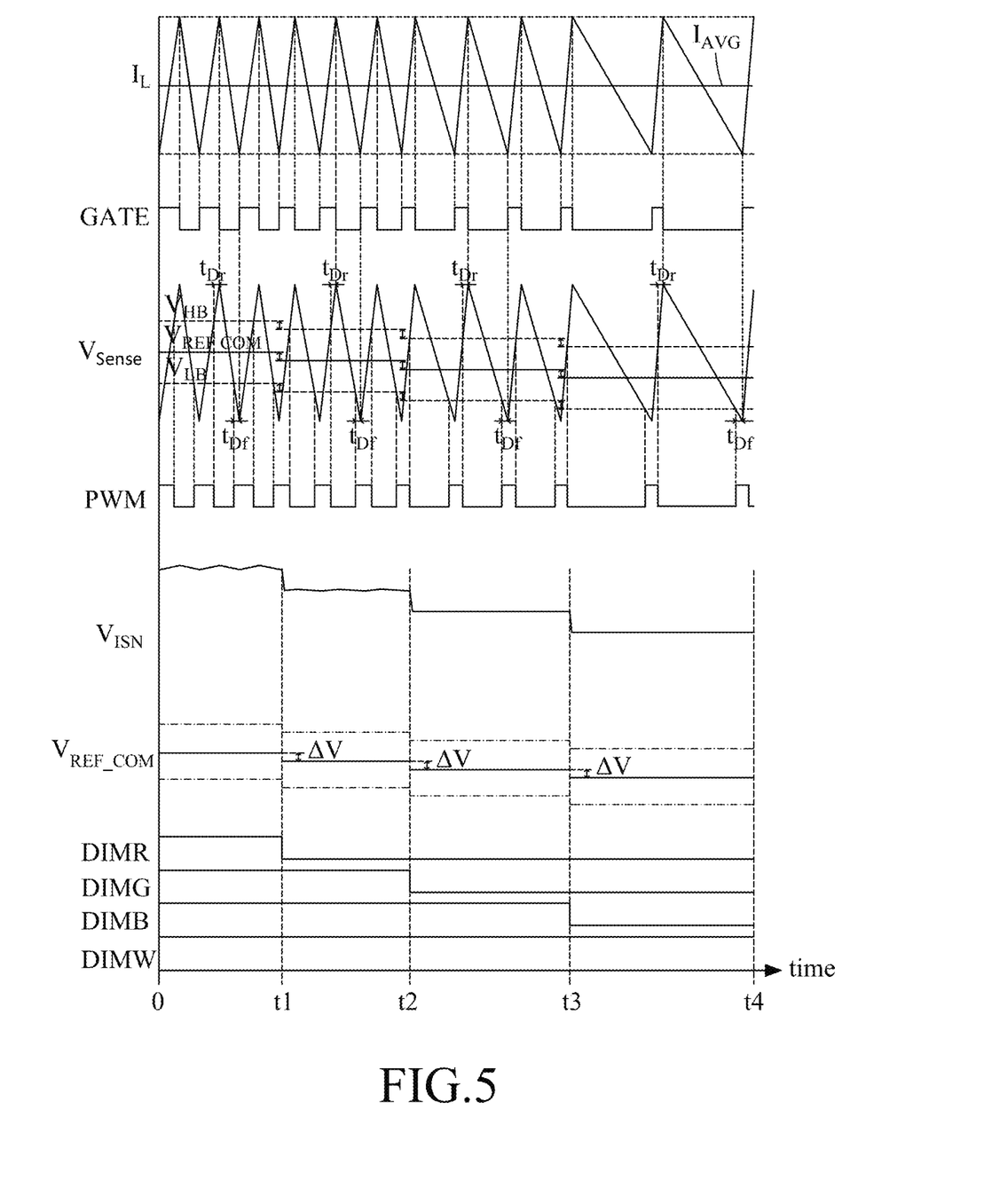
FIG. 5 is a timing diagram illustrating operations of the embodiment.

Referring to FIGS. 4 and 5, operations of the power supply system of this embodiment are described in detail below. In FIG. 5, the output current ($I_L$), the pulse signal (GATE), the sensed voltage ($V_{Sense}$), the intermediate signal (PWM), a voltage across the LEDs 101-104 ($V_{ISN}$), the reference voltage ($V_{REF\_COM}$) and the control signals (DIMR, DIMG, DIMB, DIMW) are depicted.

During a first time period from time 0 to time t1, all of the control signals (DIMR, DIMG, DIMB, DIMW) are in the logic "1" state. All of the switches (M41-M44) are in the OFF state, so the output current ($I_L$) flows through all of the LEDs 101-104 (i.e., K=4, and all of the LEDs 101-104 emit light). All of the switches (MA1-MA4) are in the ON state, so the reference voltage ($V_{REF\_com}$) is equal to $V_{REF}+4 \times \Delta V$.

Because of signal propagation delay in the power supply system, there presents a time lag by a delay time ($t_{Dr}$) between an OFF-state time point, at which the switch (Q1) enters the OFF state, and a first-threshold time point, at which the sensed voltage ($V_{Sense}$) increases above the first threshold voltage ($V_{HB}$), and there presents a time lag by a delay time ($t_{Df}$) between an ON-state time point, at which the switch (Q1) enters the ON state, and a second-threshold time point, at which the sensed voltage ($V_{Sense}$) decreases below the second threshold voltage ($V_{LB}$).

During a second time period from time t1 to time t2, three of the control signals (e.g., DIMG, DIMB, DIMW) are in the logic "1" state, and one of the control signals (e.g., DIMR) is in the logic "0" state. The switches (M42-M44) are in the OFF state, and the switch (M41) is in the ON state, so the output current ($I_L$) flows through the switch (M41) and the LEDs 102-104 (i.e., K=3, and the LEDs 102-104 emit light). The switches (MA2-MA4) are in the ON state, and the switch (MA1) is in the OFF state, so the reference voltage ($V_{REF\_com}$) is equal to $V_{REF}+3 \times \Delta V$.

An increase slop and an decrease slop of the sensed voltage ($V_{Sense}$) are respectively faster and slower during the second time period than during the first time period, so a difference between a crest of the sensed voltage ($V_{Sense}$) and the first threshold voltage ($V_{HB}$) and a difference between a trough of the sensed voltage ($V_{Sense}$) and the second threshold voltage ($V_{LB}$) are respectively larger and smaller during the second time period than during the first time period. By virtue of the power supply system making both of the first and second threshold voltages ($V_{HB}$, $V_{LB}$) lower during the second time period than during the first time period, a difference, which is between the crest of the sensed voltage ($V_{Sense}$) during the second time period and that during the first time period, and a difference, which is between the trough of the sensed voltage ($V_{Sense}$) during the second time period and that during the first time period, can be reduced as compared to the conventional hysteretic power supply system, thereby reducing a difference between an average of the output current ($I_{AVG}$) during the second time period and that during the first time period.

During a third time period from time t2 to time t3, two of the control signals (e.g., DIMB, DIMW) are in the logic "1" state, and two of the control signals (e.g., DIMR, DIMG) are in the logic "0" state. The switches (M43, M44) are in the OFF state, and the switches (M41, M42) are in the ON state, so the output current ($I_L$) flows through the switches (M41, M42) and the LEDs 103, 104 (i.e., K=2, and the LEDs 103, 104 emit light). The switches (MA3, MA4) are in the ON state, and the switches (MA1, MA2) are in the OFF state, so the reference voltage ($V_{REF\_com}$) is equal to $V_{REB}+2\times\Delta V$.

Similarly, the increase slop and the decrease slop of the sensed voltage ($V_{Sense}$) are respectively faster and slower during the third time period than during the second time period, so the difference between the crest of the sensed voltage ($V_{Sense}$) and the first threshold voltage ($V_{HB}$) and the difference between the trough of the sensed voltage ($V_{Sense}$) and the second threshold voltage ($V_{LB}$) are respectively larger and smaller during the third time period than during the second time period. By virtue of the power supply system making both of the first and second threshold voltages ($V_{HB}$, $V_{LB}$) lower during the third time period than during the second time period, a difference, which is between the crest of the sensed voltage ($V_{Sense}$) during the third time period and that during the second time period, and a difference, which is between the trough of the sensed voltage ($V_{Sense}$) during the third time period and that during the second time period, can be reduced as compared to the conventional hysteretic power supply system, thereby reducing a difference between the average of the output current ($I_{AVG}$) during the third time period and that during the second time period.

During a fourth time period from time t3 to time t4, one of the control signals (e.g., DIMW) are in the logic "1" state, and three of the control signals (e.g., DIMR, DIMG, DIMB) are in the logic "0" state. The switch (M44) is in the OFF state, and the switches (M41-M43) are in the ON state, so the output current ($I_L$) flows through the switches (M41-M43) and the LED 104 (i.e., K=1, and the LED 104 emits light). The switch (MA4) is in the ON state, and the switches (MA1-MA3) are in the OFF state, so the reference voltage ($V_{REF\_com}$) is equal to $V_{REF}+\Delta V$.

Similarly, the increase slop and the decrease slop of the sensed voltage ($V_{Sense}$) are respectively faster and slower during the fourth time period than during the third time period, so the difference between the crest of the sensed voltage ($V_{Sense}$) and the first threshold voltage ($V_{HB}$) and the difference between the trough of the sensed voltage ($V_{Sense}$) and the second threshold voltage ($V_{LB}$) are respectively larger and smaller during the fourth time period than during the third time period. By virtue of the power supply system making both of the first and second threshold voltages ($V_{HB}$, $V_{LB}$) lower during the fourth time period than during the third time period, a difference, which is between the crest of the sensed voltage ($V_{Sense}$) during the fourth time period and that during the third time period, and a difference, which is between the trough of the sensed voltage ($V_{Sense}$) during the fourth time period and that during the third time period, can be reduced as compared to the conventional hysteretic power supply system, thereby reducing a difference between the average of the output current ($I_{AVG}$) during the fourth time period and that during the third time period.

In this embodiment, the power supply system is designed in such a way that the following equation holds:

$$\Delta V = \frac{V_{ACC}}{R_{ACC}} \cdot R_{ref} = \frac{A_V \cdot V_{load} \cdot (t_{Dr} + t_{Df}) \cdot R_{sense}}{2 \cdot L},$$

where $A_V$ denotes a voltage gain of the amplifier 32, $V_{load}$ denotes a working voltage of one of the LEDs 101-104, which is a voltage across the LED when the LED emits light, $R_{Sense}$ denotes a resistance of the resistor 31, and L denotes an inductance of the inductor 23. Therefore, in a scenario where the working voltages of the LEDs 101-104 are the same, the average of the output current ($I_{AVG}$) is substantially constant, and almost does not change with the number (K); in a scenario where the working voltages of the LEDs 101-104 are different, the average of the output current ($I_{AVG}$) changes with the number (K) slightly as compared to the conventional hysteretic power supply system.

Figure 6:
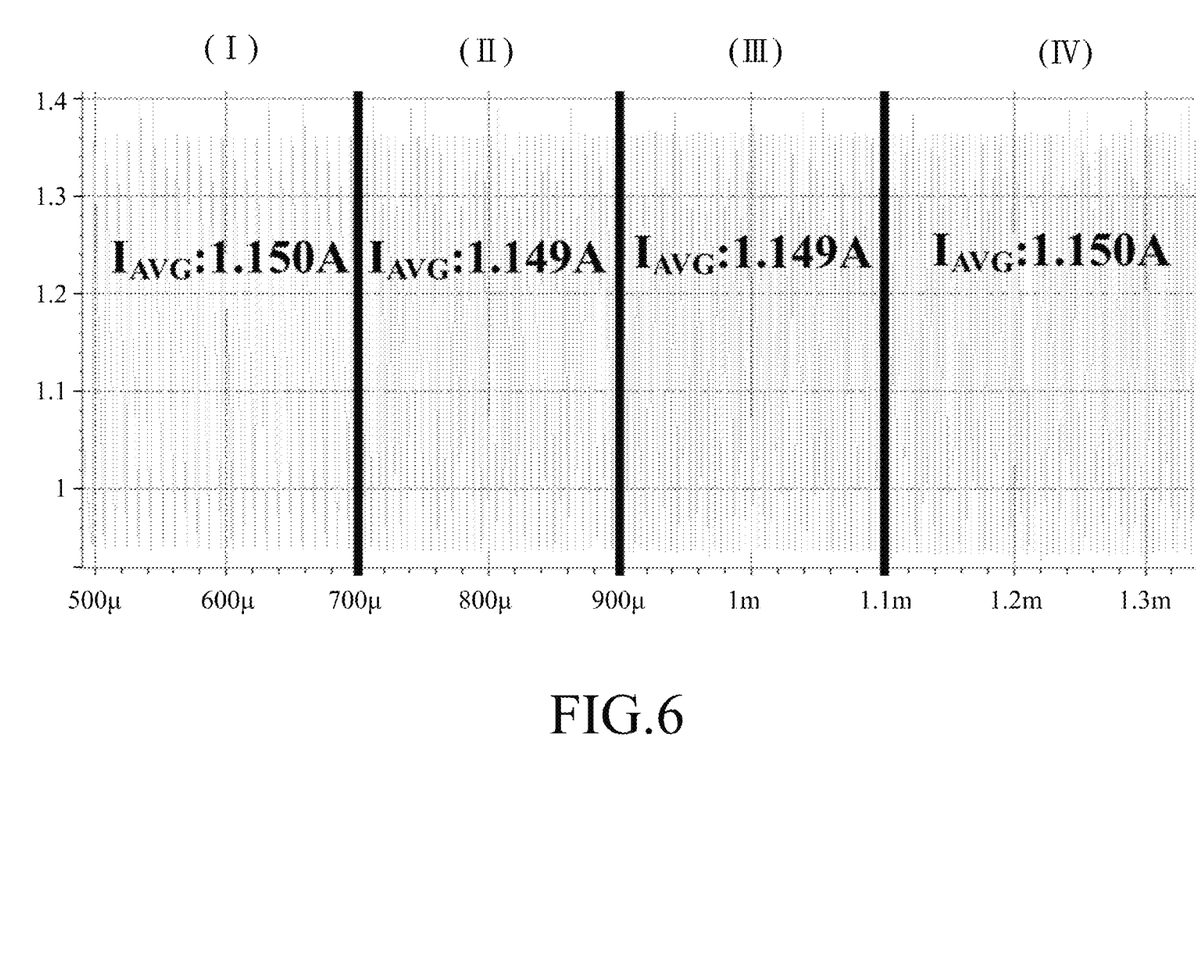
FIG. 6 is a timing diagram illustrating measurement result of an output current of the embodiment in various scenarios, in which a number of one(s) of the loads through which the output current flows is different.

FIG. 6 illustrates measurement result of the output current ($I_L$). As shown in FIG. 6, the number (K) are different in time periods (I-IV), and the average of the output current ($I_{AVG}$) is substantially the same in the time periods (I-IV).

Referring back to FIG. 4, in view of the above, in this embodiment, by virtue of the voltage generator circuit 5 adjusting the reference voltage ($V_{REF\_com}$) according to the number (K), and by virtue of the signal generator circuit 6 generating the first and second threshold voltages ($V_{HB}$, $V_{LB}$) based on the reference voltage ($V_{REF\_COM}$), the change of the average of the output current ($I_{AVG}$) (see FIG. 5) with the number (K) can be reduced or even eliminated.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that the disclosure is not limited to the disclosed embodiment but is intended to cover various arrangements included within the spirit and scope of the broadest interpretation so as to encompass all such modifications and equivalent arrangements.

What is claimed is:
1. A power supply system operatively associated with a load unit, the load unit including a first terminal, a second terminal, and a plurality of loads that are coupled in series between the first and second terminals thereof, said power supply system comprising:
   a current driver circuit to receive a pulse signal, and generating an output current based on the pulse signal; the output current increasing within each pulse of the pulse signal, and decreasing outside each pulse of the pulse signal;
   a sensor circuit coupled to said current driver circuit, and adapted to be further coupled to the first terminal of the load unit; said sensor circuit allowing the output current to flow therethrough from said current driver circuit to the first terminal of the load unit, and sensing the output current to generate a sensed voltage;

a control circuit adapted to be coupled to the loads, and to receive a control input; for each of the loads, said control circuit being operable, based on the control input, to allow or not to allow the output current to flow through the load;

a voltage generator circuit to receive the control input, and generating a reference voltage based on the control input; the reference voltage being correlated to a number of one(s) of the loads through which the output current flows; and a signal generator circuit coupled to said sensor circuit, said voltage generator circuit and said current driver circuit, and to receive the sensed voltage and the reference voltage respectively from said sensor circuit and said voltage generator circuit; said signal generator circuit generating a first threshold voltage and a second threshold voltage based on the reference voltage, and comparing the sensed voltage with the first and second threshold voltages to generate the pulse signal for receipt by said current driver circuit.

2. The power supply system of claim 1, wherein said current driver circuit includes:

a switch having a first terminal that is to receive a supply voltage, a second terminal, and a control terminal that is coupled to said signal generator circuit to receive the pulse signal therefrom;

a diode having a cathode that is coupled to said second terminal of said switch, and an anode that is adapted to be coupled to the second terminal of the load unit; and an inductor having a first terminal that is coupled to said second terminal of said switch, and a second terminal that is coupled to said sensor circuit and that provides the output current.

3. The power supply system of claim 1, wherein said sensor circuit includes:

a resistor having a first terminal that is coupled to said current driver circuit to receive the output current therefrom, and a second terminal that is adapted to be coupled to the first terminal of the load unit; and an amplifier having a non-inverting input terminal that is coupled to said first terminal of said resistor, an inverting input terminal that is coupled to said second terminal of said resistor, and an output terminal that is coupled to said signal generator circuit and that provides the sensed voltage.

4. The power supply system of claim 1, wherein the control input includes a plurality of control signals, and said control circuit includes:

a plurality of switches each adapted to be coupled to a respective one of the loads in parallel; and a controller coupled to said switches, to receive the control signals, and controlling operation of each of said switches between an ON state and an OFF state based on a respective one of the control signals.

5. The power supply system of claim 4, wherein said controller generates a plurality of signals, which are respectively complementary to the control signals, to respectively control the operations of said switches.

6. The power supply system of claim 1, wherein said voltage generator circuit includes:

a first current generator generating a compensation current;

a second current generator coupled to said first current generator to receive the compensation current therefrom, to receive the control input, and generating a reference current based on the compensation current and the control input; the reference current being equal to a product of the compensation current and the number of the one(s) of the loads through which the output current flows; and a reference voltage generator coupled to said second current generator and said signal generator circuit, to receive the reference current from said second current generator, and generating the reference voltage for receipt by said signal generator circuit based on the reference current.

7. The power supply system of claim 6, wherein the control input includes a plurality of control signals, and said second current generator includes:

a current mirror coupled to said first current generator to receive the compensation current therefrom, and generating a plurality of mirrored currents based on the compensation current; each of the mirrored currents being equal to the compensation current;

a plurality of switches each having a first terminal, a second terminal and a control terminal; said first terminals of said switches being coupled to said current mirror to respectively receive the mirrored currents therefrom; said second terminals of said switches being coupled to each other, and being further coupled to said voltage generator; said control terminals of said switches being to respectively receive the control signals; the reference current being provided at a common node of said switches.

8. The power supply system of claim 1, wherein said signal generator circuit includes:

a threshold voltage generator coupled to said voltage generator circuit to receive the reference voltage therefrom, and generating the first and second threshold voltages based on the reference voltage; the second threshold voltage being lower than the first threshold voltage; an average of the first and second threshold voltages being equal to the reference voltage;

a first comparator having an inverting input terminal that is coupled to said threshold voltage generator to receive the first threshold voltage therefrom, a non-inverting input terminal that is coupled to said sensor circuit to receive the sensed voltage therefrom, and an output terminal;

a second comparator having an inverting input terminal that is coupled to said sensor circuit to receive the sensed voltage therefrom, a non-inverting input terminal that is coupled to said threshold voltage generator to receive the second threshold voltage therefrom, and an output terminal;

an RS flip-flop having a reset terminal that is coupled to said output terminal of said first comparator, a set terminal that is coupled to said output terminal of said second comparator, and an output terminal that provides an intermediate signal; and a level shifter coupled to said output terminal of said RS flip-flop to receive the intermediate signal therefrom, further coupled to said current driver circuit, and translating the intermediate signal from a voltage domain to another voltage domain to generate the pulse signal for receipt by said current driver circuit.

* * * * *